United States Patent [19]

Cachier et al.

[11] 4,197,546

[45] Apr. 8, 1980

[54] MILLIMETER WAVE SOURCE INCORPORATING A SOLID-STATE ACTIVE COMPONENT AND A DIRECTIONAL ANTENNA

[75] Inventors: Gérard Cachier; Jacques Espagnol, both of Paris, France

[73] Assignee: Thomson-CSF, Paris, France

[21] Appl. No.: 841,609

[22] Filed: Oct. 12, 1977

[30] Foreign Application Priority Data

Oct. 15, 1976 [FR] France .............................. 76 31069

[51] Int. Cl.² .......................... H01Q 1/42; H01Q 3/16
[52] U.S. Cl. ..................................... 343/701; 343/785
[58] Field of Search ............... 343/780, 701, 702, 785; 331/96, 97, 107 G, 177 V; 333/82 R, 83 R

[56] References Cited

U.S. PATENT DOCUMENTS

| | | | |
|---|---|---|---|
| 3,618,091 | 11/1971 | Butler | 343/701 |
| 3,806,942 | 4/1974 | Preti | 343/702 |

FOREIGN PATENT DOCUMENTS

| | | |
|---|---|---|
| 2038614 | 8/1970 | Fed. Rep. of Germany . |
| 2348155 | 5/1974 | Fed. Rep. of Germany . |
| 2247735 | 9/1975 | France . |
| 2274051 | 2/1976 | France . |
| 2287115 | 4/1976 | France . |
| 1374948 | 11/1974 | United Kingdom . |

Primary Examiner—David K. Moore
Attorney, Agent, or Firm—Oblon, Fisher, Spivak, McClelland & Maier

[57] ABSTRACT

A device facilitating the design and adjustment of millimeter wave sources comprising an active component of quasi-microscopic dimensions which has to be coupled with extreme accuracy to the input of a directional antenna having relatively large dimensions. In various embodiments the device exhibits the following common features: an assembly incorporating a solid-state active component, a resonant cavity, means for coupling said cavity to a directional antenna, adjusting means and a directional antenna, said assembly being fitted in such a manner that a simultaneous adjustment of the position of said component in said cavity and of said coupling means, is made possible by acting upon said adjusting means.

4 Claims, 7 Drawing Figures

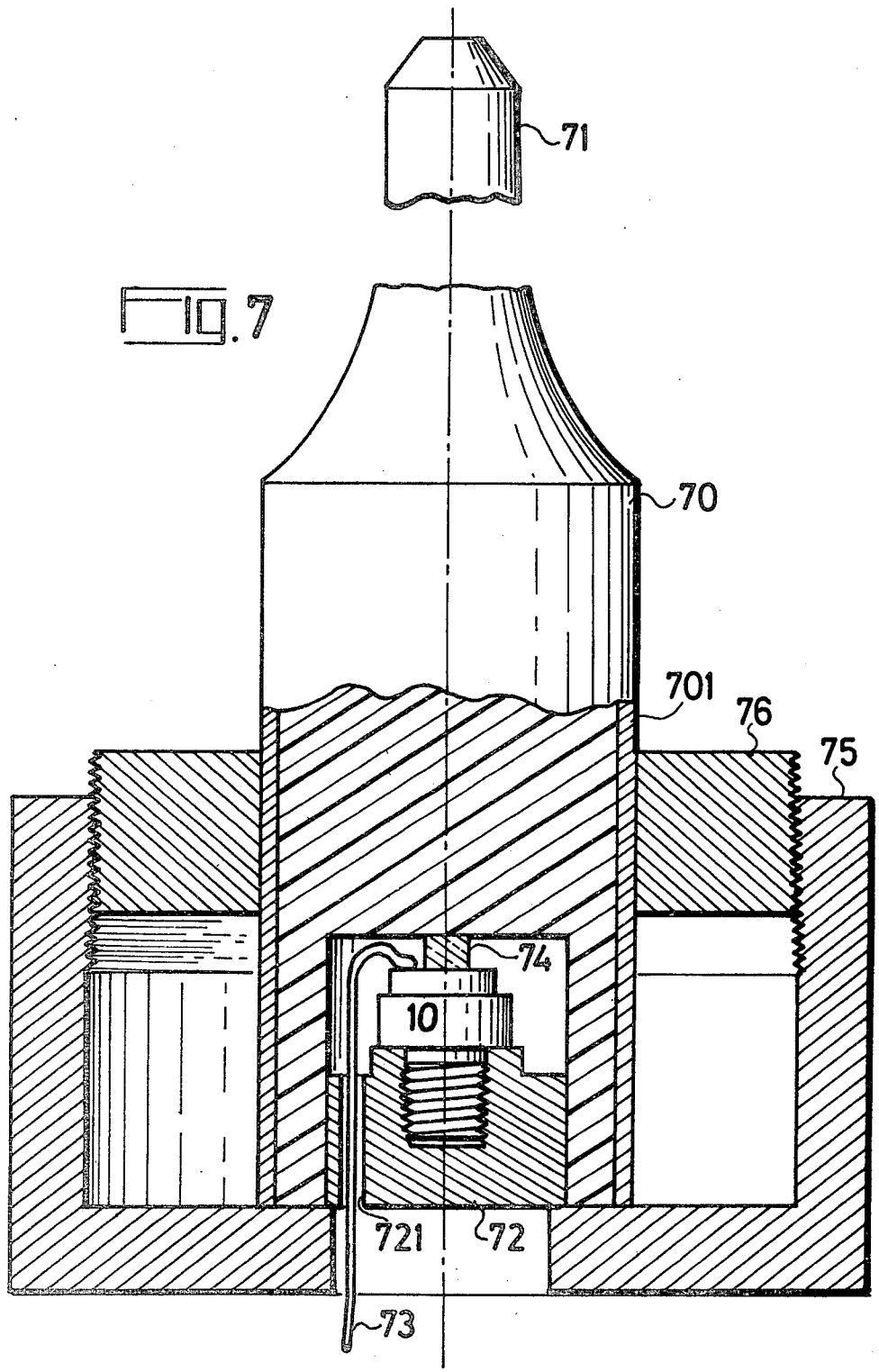

MILLIMETER WAVE SOURCE INCORPORATING A SOLID-STATE ACTIVE COMPONENT AND A DIRECTIONAL ANTENNA

The present invention relates to solid-state millimeter wave sources.

Known sources comprise one solid-state component of the negative-resistance diode kind for example, means for assembly and matching the component to an antenna (horn antenna, dielectric structure), or to a transmission system (waveguide, microstrip or the like) and electrical contact means for the supply arrangement.

Millimeter sources are known where the diode is embedded in a block doing duty as electrical earth resonant cavity, heatsink and incorporating means for matching the impedance of the semiconductor medium to the transmission medium. The adjustment of such a block on a predetermined frequency and on a predetermined radiated power is rather uncertain. As a matter of fact, when the frequency is right, the radiated power is wrong and vice-versa.

The invention allows the simultaneous adjustment of generated frequency and radiated power.

According to the invention, there is provided a millimeter wave source comprising an assembly incorporating a solid-state active component, a resonant cavity, a coupling means and a directional antenna, and adjusting means, said assembly being fitted in such a manner that a simultaneous adjustment of the position of said component in said cavity and of said coupling means is made possible by acting upon said adjusting means.

The invention will be better understood and other of its features rendered apparent from a consideration of the ensuing description and the accompanying drawings in which.

Figure 4:
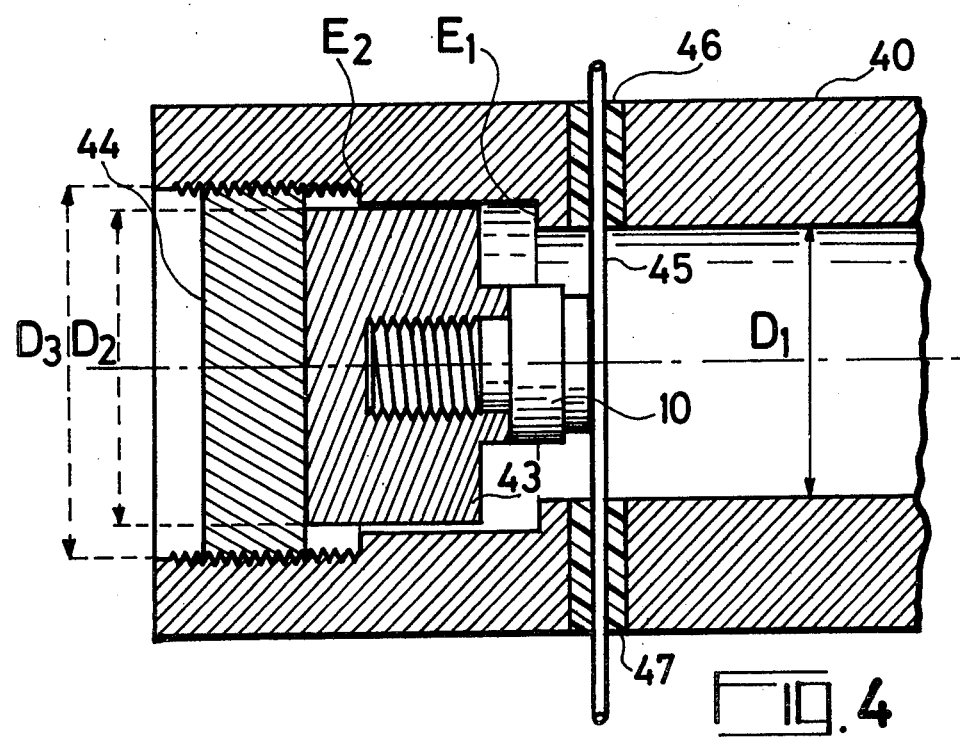
Figure 5:
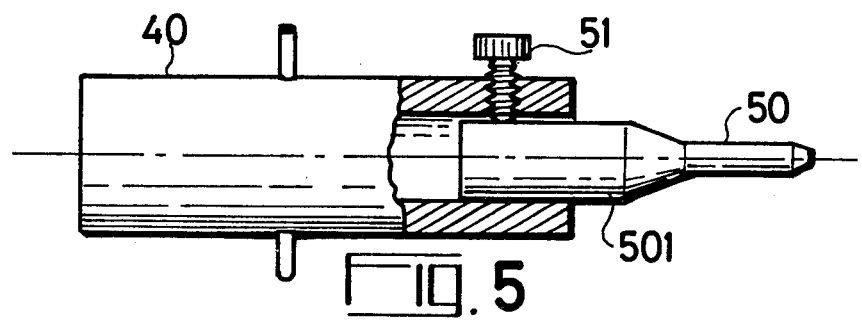
Figure 6:
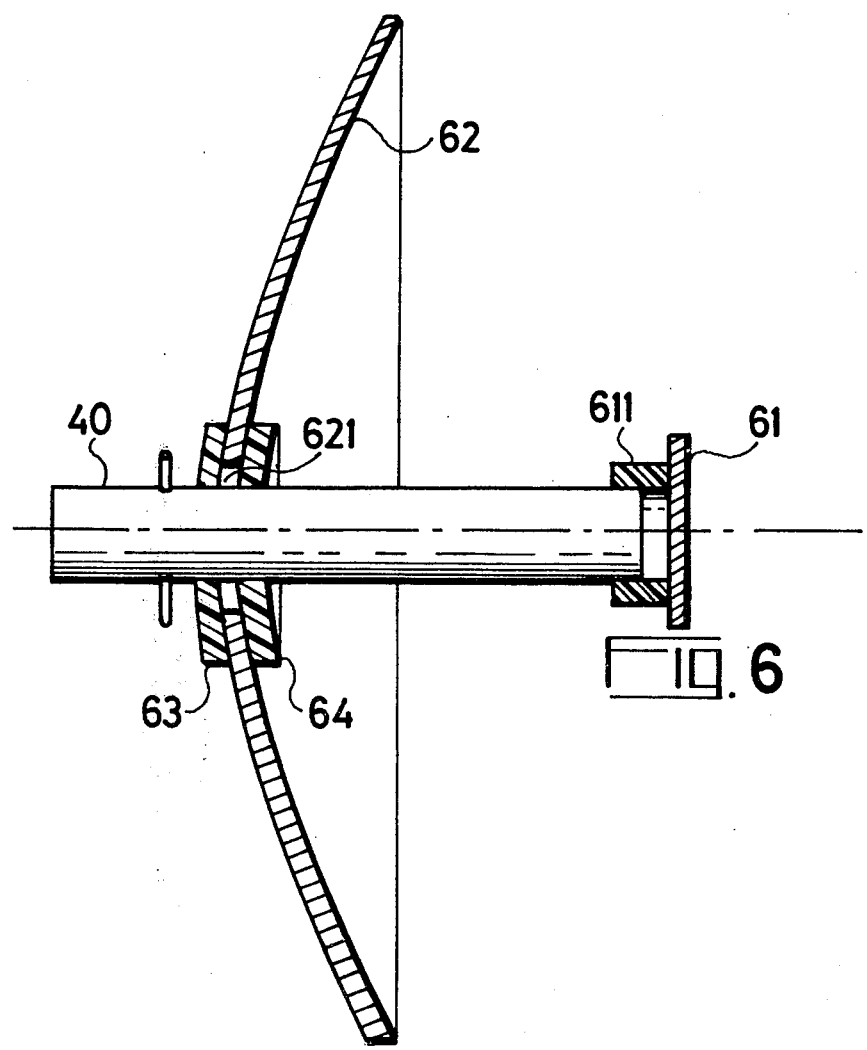

FIG. 4 relates to a detail common to two other embodiments shown in FIGS. 5 and 6.

FIG. 7 illustrates another embodiment of the invention.

In a first embodiment of the invention, there is provided a millimeter wave source, wherein said assembly consists of a base constituted by a metal plate to which the solid state component is attached in a fixed manner and a metal cover having a cut-out and constituting the ceiling and the walls of said resonant cavity, whose floor is said metal plate, and fixing means comprising:

a screw having a head of a first maximal diameter and a rod of a second maximal diameter;

a dielectric washer having a third diameter as an internal diameter and a fourth diameter as an external diameter;

an opening in said metal plate having a fifth diameter;

the second, third, fifth, first and fourth diameter forming a growing series in such a manner that an adjustment is possible by acting on said screw and said washer, making it possible to adjust the position of said solid state component in said cavity and the coupling means of said cavity to the directional antenna formed by the cut-out part of said cover.

Figure 1:
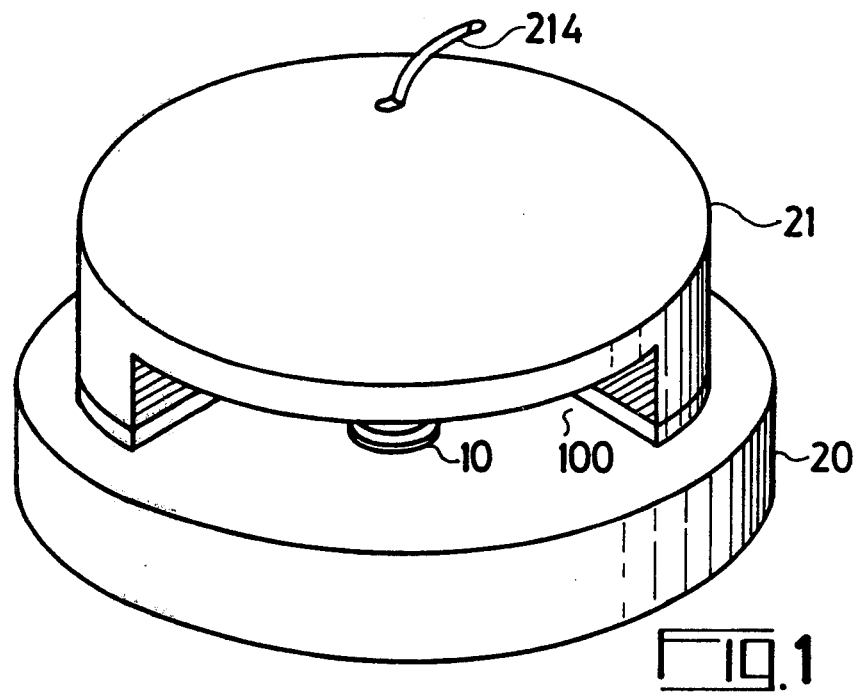
FIGS. 1 and 2 illustrate respectively in perspective and sectional views, a first embodiment of the invention.
Figure 2:
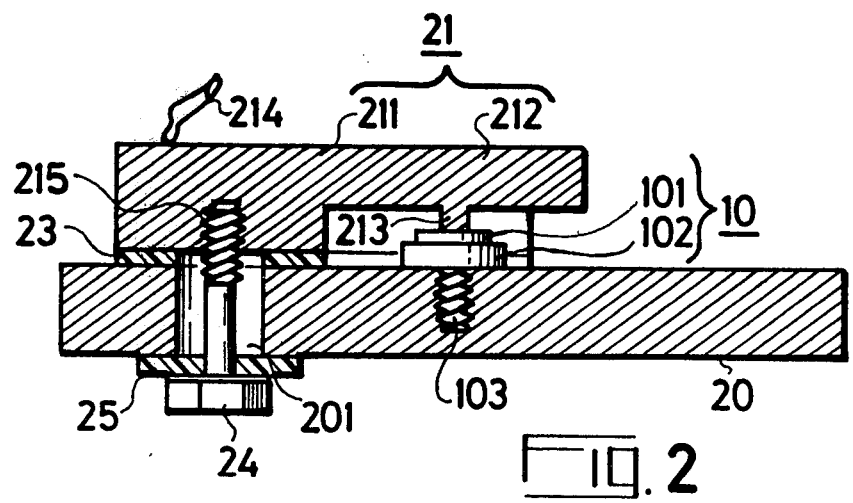

In the example shown in FIG. 1 in perspective and in FIG. 2 in cross-section, the solid-state component is a diode 101 of negative resistance kind, integrated into a block 10 having a cylindrical base 102 equipped with a screwed fixing rod 103.

In this embodiment, the resonant cavity performs the function of a directional antenna; the cavity acquires its resonance characteristics due to the provision of a cut-out 100 formed in the cover 21.

The cavity has a base constituted by a gold-plated copper plate 20 of cylindrical shape, and the cover 21 constituting the "ceiling" and "walls" of the cavity. The diode 101 is fixed approximately at the centre of the plate which to that end contains a threaded hole into which the screwed rod 103 can be screwed. In addition, the plate is provided at its periphery with a cylindrical opening 201 used to attach the cover in the manner indicated hereinafter.

The cover 21 which is of goldplated copper, has a solid part 211 and a recessed part 212 in which a cylindrical projection 21 is left, this being designed to make contact with the top part of the diode 101 which itself has a bias electrode that has not been shown. Bias is effected via a lead 214 soldered to the cover 21.

A dielectric plate 23 cut as required, insulates the cover 21 from the plate 20. Its thickness is adjusted in such a fashion that the projection 213 effects good contact with at least part of the top electrode of the diode 101. In addition, a hexagon-headed screw 24 whose head is wider than the opening 201, is screwed into a threaded hole 215 in the solid part 201 of the cover 21. This screw, insulated from the plate 20 by a dielectric washer 25, has a very large clearance in the cylindrical opening 201; it is therefore possible to slightly displace the cover 21 in relation to the diode, contact being maintained in all positions due to the width of the diode electrode (or that of the projection 213), the additional facility being provided that the contact pressure can be adjusted by varying the compressibility of the dielectric in plate 23 and washer 25.

In a second embodiment of the invention, there is provided an assembly comprising a mounting that supports said solid-state component and a dielectric structure in which an opening is formed, said opening being placed upon said mounting in order to cover said component and said structure being extended by a dielectric antenna, said adjustment means consisting of a fixing device supported by said mounting and allowing a translation of said structure with respect to said mounting.

Figure 3:
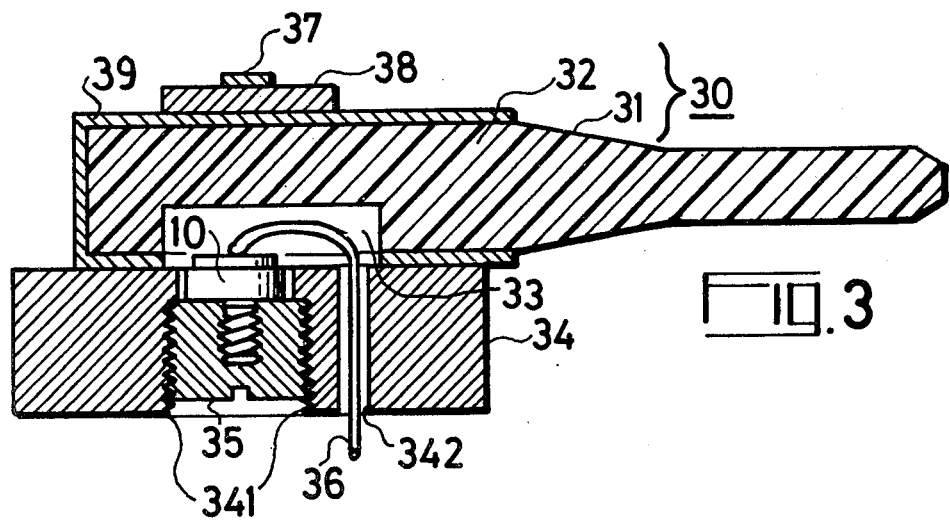
FIG. 3 illustrates a second embodiment of the invention.

In the example shown in cross-section in FIG. 3, there is a block 10 similar to that of the first example (FIGS. 1 and 2), placed in a resonant cavity formed by a dielectric structure 30 in which a parallelepiped opening 33 is formed, the latter being closed off at one of its faces by a metal mounting 34 constituting the electrical earth of the source.

The dielectric structure 30 comprises a parallelepiped part 32 delimited by a metallised area 39 interrupted at the level of the opening 33 and held on the mounting 34 by a partially illustrated fixing device 37 having a flange 38. This flange enables the structure 30 to slide on the mounting so that the position of the solid-state component within the resonant cavity can be adjusted so varying the coupling between component and dielectric structure. In addition, the structure is extended laterally by a dielectric antenna 31 made of the same material as the whole of the structure 30 (for example polytetrafluorethylene) and having an elongated shape corresponding for example to ten wavelengths (measured in the dielectric at the frequency of oscillation of the source). In this fashion, a radiation pattern can be obtained whose primary lobe has an apertural angle of 20°.

The mounting 34 comprises a first cylindrical opening 341 of large diameter, designed to allow the block 10 to be introduced into the resonant cavity. The block 10 is fixed to a metal plug 35 screwed into a threaded portion of the opening 341.

Biasing is effected through the agency of an enamelled wire soldered to the electrode provided for the purpose on the block 10. The wire emerges from the source through a second cylindrical opening 342 of small diameter, formed in the mounting 34 and opening onto the recess 33.

The electromagnetic vibrational mode in the resonant cavity will for example be of $TE_{10}$ type: this is achieved by the person skilled in the art in the conventional manner, through appropriate calculation of the dimensions of the resonant cavity.

In the embodiments shown in FIGS. 5 and 6 the resonant cavity takes the form of a cylindrical waveguide 40. A first end of the waveguide, the source end, is associated with a device for positioning and biasing the solid-state component (details in FIG. 4). A second end of the waveguide is associated either with a dielectric antenna 50 (FIG. 5) or with a device comprising two reflectors 61 and 62 one of which (62) is a parabolic mirror.

As FIG. 4 shows, the external diameter of the waveguide 40 is constant whilst the internal diameter has increasing values $D_1$, $D_2$ and $D_3$ in the direction towards the first end. A shoulder $E_1$ marks the first diameter discontinuity and the shoulder $E_2$ the second. The shoulder $E_1$ acts as a stop for a metal plug 43 of diameter $D_2$ carrying the block 10 and designed to slide in the waveguide without any clearance, over a length which is limited on the one hand by the stop $E_1$ and on the other by a screwed metal core 44 which screws into a threaded hole formed in that end of the waveguide which has the diameter $D_3$.

The bias device comprises two diametrally opposed openings 46 and 47 formed in the thickness of the waveguide level with a section of diameter $D_1$ fairly close to the shoulder $E_1$ so that the bias electrode of the solid-state component engages beyond said section before the plug 43 comes up against the stop $E_1$. The two openings, equipped with insulating sleeves designated by the same references as the openings (46, 47), pass one and the same deformable rod 45 which is made of a metal having good electrical conductivity. This rod is connected to one of the poles of a direct supply source (not shown), the other pole being taken to the electrical earth constituted by the waveguide 40, the plug 43 and the core 44. The flexibility of the rod procures the lost motion required for the adjustment of the position of the diode in the resonant cavity.

That end of the waveguide shown in FIG. 4 is virtually identical in the embodiments in FIGS. 5 and 6. In the case shown in FIG. 5, the opposite end is simply equipped with at least one blocking screw 51 which serves to adjust the position of the cylindrical part 501 of the antenna 50 in the waveguide. In the case of FIG. 6, this end is covered by a dielectric sleeve 611 (for example of polytetrafluorethylene) stuck to a metal disc 61 constituting a flat reflector vis-a-vis millimetric waves. A second reflector 62, which is a parabolic reflector, is traversed by the waveguide 40 at its crown and is located at the same side of the solid-state component, in relation to the plane of the reflector 61, the focus of the paraboloid being in the neighbourhood of the latter. The reflector 62 is held in the correct position (its axis of revolution coincidental with the axis of the waveguide) by two dielectric wedges 63 and 64. The electromagnetic mode of vibration is of $TE_{11}$ type:

This result is achieved by the person skilled in the art in a conventional way, through appropriate calculation of the dimensions of the resonant cavity and of the cylindrical waveguide.

In the case of the embodiment shown in FIG. 5, the positioning of the dielectric antenna is involved in the adjustment of the resonant cavity.

In the example shown in FIG. 7, the resonant cavity is located inside the dielectric structure 70, for example a solid of revolution although it could equally well be parallelepiped in form. The structure is extended by a dielectric antenna 72 of around 10 wavelengths. Only the structure 70 is covered by a metallised coating 70. The block 10 comprising the solid-state component is assembled on the plug 71 containing an opening 721 for the introduction of an enamelled wire 73 which does duty as the bias lead. A dielectric plug 74, for example of polytetrafluorethylene, makes it possible by variation in its thickness, to adjust the position of the solid-state component within the resonant cavity. In order to consolidate the device, the structure 70 is surrounded by an arrangement comprising a mounting 75 which is a cylinder with a flat base containing a hole for the passage of the by-pass lead, and a screwed adjuster ring 76 clamping the dielectric structure.

What we claim is:

1. A millimeter wave source comprising an assembly incorporating a solid-state active component, a resonant cavity, a directional antenna, coupling means for coupling said cavity to said directional antenna, and adjusting means, said assembly being fitted in such a manner that a simultaneous adjustment of the position of said component in said cavity and of said coupling means is made possible by acting upon said adjusting means, wherein said assembly consists of a base constituted by a metal plate to which the solid state component is attached in a fixed manner and a metal cover having a cut-out and constituting the ceiling and the walls of said resonant cavity, whose floor is said metal plate, and fixing means comprising:

a screw having a head of a first maximal diameter and a rod of a second maximal diameter;

a dielectric washer having a third diameter as an internal diameter and a fourth diameter as an external diameter;

an opening in said metal plate having a fifth diameter;

the second, third, fifth and fourth diameters forming a growing series in such a manner that an adjustment is possible by acting on said screw and said washer, making it possible to adjust the position of said solid state component in said cavity, and the coupling means of said cavity to the directional antenna formed by the cut-out part of said cover.

2. A millimeter wave source comprising an assembly incorporating a solid-state active component, a resonant cavity, a directional antenna, coupling means for coupling said cavity to said directional antenna, and adjusting means, said assembly being fitted in such a manner that a simultaneous adjustment of the position of said component in said cavity and of said coupling means is made possible by acting upon said adjusting means, wherein said assembly comprises a mounting that supports said solid-state component and a dielectric structure in which an opening is formed, said opening being placed upon said mounting in order to cover said component and said structure forming a dielectric antenna, said adjustment means consisting of a fixing device supported by said mounting and allowing a translation of said structure with respect to said mounting.

3. A millimeter wave source comprising an assembly incorporating a solid-state active component, a resonant cavity, a directional antenna, coupling means for coupling said cavity to said directional antenna, and adjusting means, said assembly being fitted in such a manner that a simultaneous adjustment of the position of said component in said cavity and of said coupling means is made possible by acting upon said adjusting means,
   wherein said resonant cavity is a cylindrical waveguide section a first end of which is equipped with a device for positioning and biasing the solid-state component, while the second end is equipped with a dielectric structure emerging from the waveguide and extended in the form of a dielectric antenna, and
   said dielectric structure has a cylindrical shape to allow it to slide in the waveguide in order to adjust the resonant cavity, locking means making it possible to secure it in position after adjustments have been made,
   wherein said positioning device comprises a metal plug which can slide in the waveguide under the control of a screw core and the bias device comprises a deformable connecting rod passing through the walls of the waveguide.

4. A millimeter wave source comprising an assembly incorporating a solid-state active component, a resonant cavity, a directional antenna, coupling means for coupling said cavity to said directional antenna, and adjusting means, said assembly being fitted in such a manner that a simultaneous adjustment of the position of said component in said cavity and of said coupling means is made possible by acting upon said adjusting means,
   wherein said resonant cavity is formed in a dielectric structure forming a dielectric antenna, said structure having a threaded recess accommodating a metal plug on which said solid-state active component is assembled, in such a manner that an adjustment is possible by screwing said plug in said recess.

* * * * *